June 7, 1960 J. H. WAUGH, JR 2,940,027

TRANSISTOR OSCILLATOR CIRCUIT

Filed Aug. 7, 1956

INVENTOR

James H. Waugh, Jr.

BY Stevens, Davis, Miller and Mosher

ATTORNEYS 2,940,027

Patented June 7, 1960

2,940,027

TRANSISTOR OSCILLATOR CIRCUIT

James H. Waugh, Jr., Dallas, Tex., assignor to Texas Instruments Incorporated, Dallas, Tex., a corporation of Delaware Filed Aug. 7, 1956, Ser. No. 602,595

2 Claims. (Cl. 318—128)

The present invention relates to electrical apparatus composed of a free running transistor oscillator circuit driving a vibrating reed for the purpose of interrupting light impinging on a light-sensitive device, such as a photo-transistor.

The apparatus principally functions as a light chopper to interrupt light from a steady or uninterrupted source at regular intervals so that output of the light-sensitive device upon which the light impinges will be an A.C. signal, the amplitude of which varies as the intensity of the light source. The particular arrangement allows A.C. amplifiers to be employed with the light-sensitive device. It will be appreciated that A.C. amplifiers are inherently more stable than D.C. amplifiers and consequently the circuitry will have greater stability. Hence, the electrical signals produced at the output of the light-sensitive device are better amplified while retaining an intelligible relationship with the light source which is varying responsive to a condition to be indicated, measured, detected, or otherwise controlled.

Circuitry involving a light-sensitive element has been subject to various disadvantages. If the signals generated in the light-sensitive element are responsive to a steady or uninterrupted light source, which is varying in intensity in response to a condition, then the output of the light-sensitive device will be a D.C. current and it is necessary to employ D.C. amplifiers. It has been recognized, however, as more desirable to generate A.C. signals at the output of the light-sensitive device so that A.C. amplifiers can be used. As mentioned above, A.C. amplifiers are inherently more stable than D.C. amplifiers. Various circuits and arrangements have been heretofore proposed to solve one or more parts of this problem, but the offered solutions thus far fall shy of a complete and workable solution to this problem.

It is, accordingly an object of the present invention to provide a very simple compact apparatus for use in conjunction with a light-sensitive device to interrupt, in a regular fashion, light impinging on the device. The interruptions are produced by means of a free-running transistor oscillator circuit cooperating with a transistor transformer and vibrating reed having a flag which projects across the path of the light impinging on the light-sensitive device. The operation of the apparatus results in the flag interrupting the light at regular intervals without in any way affecting the intensity of the light so that pulsations of light rays ultimately impinge on the light-sensitive device. Under these conditions the light-sensitive device generates A.C. signals with the amplitude of the signal being correlated with light intensity.

It is a further object of the present invention to provide unique apparatus for functioning as above described which is extremely simple in make-up, fool-proof in operation, and of exceedingly small dimensions.

Other and further objects of the present invention will become more fully apparent from the following detailed description when taken in conjunction with the appended drawings in which.

Figure 1:
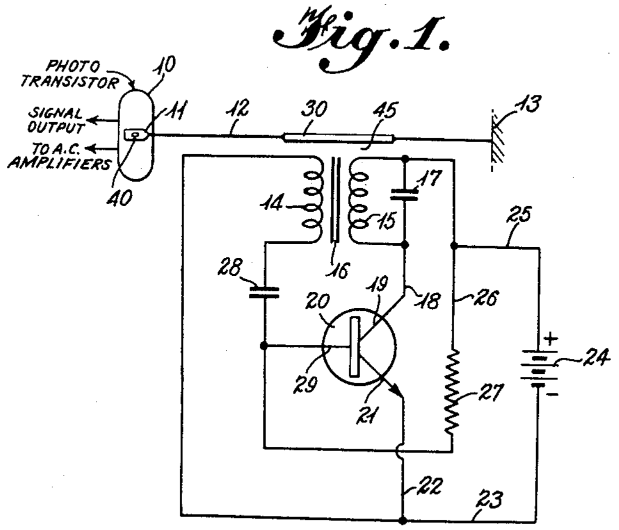
Figure 1 is a schematic view of the circuitry of the present invention.

Referring now to the drawings, there will be described a preferred embodiment of the present invention. As shown in Figure 1, a light-sensitive device, such as a photo-transistor 10, is suitably arranged in the path of a light source (not shown) with a flag 11 interposed between the photo-transistor 10 and the light source. In the showing of Figure 1, the light source is positioned at a point above the plane of the paper. The flag 11 is located at the extreme end of a reed 12 with the other end of the reed anchored as indicated at 13. The reed 12 is caused to vibrate by means of windings 14 and 15 which in the circumstances of the invention are part of a transistor transformer. Winding 14 is characterized by a low impedance whereas the winding 15 is characterized by a high impedance. The core of the transistor transformer is generally designated by the numeral 16. The reed 12 includes a Mumetal strip 30 which in repose is spaced from core 16 by air gap 45. A condenser 17 is connected in parallel with the winding 15 and a lead 18 connects one side of coil 15 and condenser 17 to the collector electrode 19 of a transistor 20. The emitter electrode 21 of transistor 20 is connected by lead 22 to lead 23 which goes to the negative terminal of a suitable voltage supply such as a battery 24. The positive terminal of battery 24 is connected by means of lead 25 to lead 26 which connects one end of a resistor 27 with the other side of the coil 15-condenser 17 combination. The negative terminal of the battery 24 is connected by lead 23 to one end of the low impedance coil 14. The other end of the coil 14 is connected to a condenser 28 which in turn is connected to the base electrode 29 of transistor 20 and the other end of the resistor 27.

The operation of the circuit described is as follows. Upon application of voltage to the circuit, current flows through the transistor 20 and the high impedance winding 15 of the transistor transformer. The reed 12 in the vicinity of the transistor transformer is characterized by a section of Mumetal 30 as previously described. This section or strip 30 is attracted to the iron core 16 of the transistor transformer causing the reed 12 to flex downwardly. The reed member is tuned to a certain natural vibratory frequency as is determined by its physical make-up and resilient support. Upon reaching the core 16 of the transistor transformer, the air gap 45 has been substantially narrowed and the Mumetal strip 30 provides more flux coupling for the transistor transformer core 16. This results in a voltage being induced in the low impedance winding 14 of the transistor transformer. The induced voltage is capacitor coupled via condenser 28 to the base electrode 29 and emitter electrode 21 and is sufficient to cut off the transistor current. Consequently, the transformer current is also cut off. The reed 12, having thus been relieved of the magnetic attraction of the transistor transformer, swings up and away from the core 16. During this movement, the Mumetal strip 30 swings away from the transistor transformer core 16 and the air gap 45 is increased. Accordingly, the flux path in the core encounters greater reluctance and as a result the voltage in the low impedance winding 14 will drop. This drop in voltage in turn produces a drop between the base electrode 29 and emitter electrode 21 of the transistor to an extent to allow current to flow again through the transistor 20. When this occurs, the high impedance winding 15 of the transistor transformer will again attract the Mumetal strip 30 and the process will be repeated. The purpose of the resistance 27 is to provide the proper bias current to the base electrode 29 of the transistor 20. The function of the condenser 17 connected across the high impedance winding 15 is to prevent the circuit from oscillating at a frequency higher than the natural frequency of the reed 12.

Figure 2:
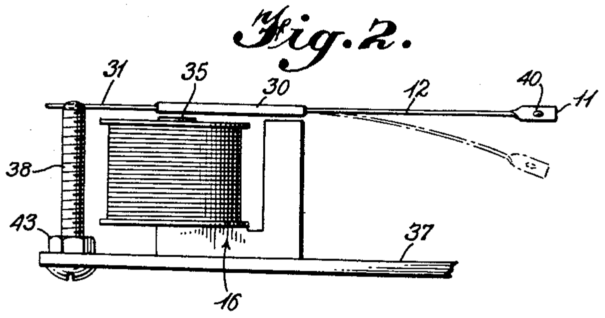
Figure 2 is a view in side elevation of the reed-actuating parts.

The construction and characteristics of the transistor transformer are shown generally in Figure 2. The core 16 is, as will be appreciated, U-shaped with the coils 14 and 15 being wound on one leg 35 of the core 16. The core 16 is mounted on a plate 37 which can desirably be a printed circuit board. Threadedly engaged with the plate 37 is a screw 38 which has the end of the reed 12 anchored to it by any suitable means, such as, for example, soldered to it. Nut 43 locks the screw 37 in a fixed position while permitting adjustment. The reed 12 is composed of Mumetal strip 30 which has soldered to it a resilient wire 31 which may be, for example, a steel music wire. The wire 31 is anchored to the screw 38. Soldered to the other end of the Mumetal strip 30 is a strip 32 such as, for example, a length of 1/32 inch by .002 brass shim stock. The flag 11 is made by turning the brass strip 90° as shown clearly in Figure 3.

Figure 4:
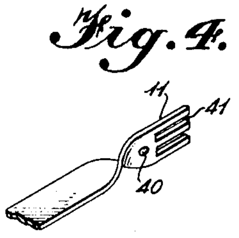
Figure 4 is a view in perspective showing an alternative form of reed.

As shown in Figure 4, the flag 11 can be slotted as indicated by numeral 41 to appear as a series of fingers.

The entire device is inherently small due to the use of transistors, etc., and thus the reed 12 is of quite small dimensions and small mass. Although this could lead to difficulties in obtaining sufficient attraction between the transformer windings 14 and 15 and the reed member 12, the use of the Mumetal strip 30 avoids all such problems. To prevent the reed member from sticking to the transformer core it may be necessary to line the pole faces of core 16 with a small strip of "Mylar" film tape or other equivalent means. In order to tune the reed member 12 to the proper natural oscillatory frequency, a solder dot 40 can be added to the flag 11 in order to provide sufficient mass at the end of the reed 12. Small changes in natural frequency of oscillation of the reed are possible by carving small shavings of solder from the dot 40.

Figure 3:
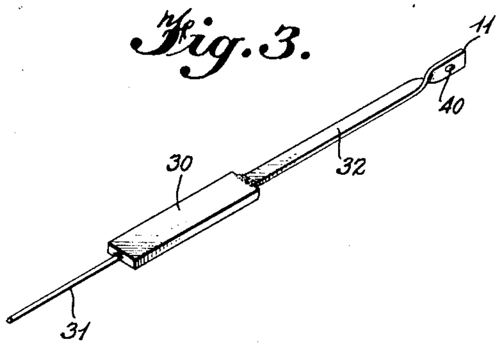
Figure 3 is a view in perspective of one form of reed.

The arrangement of Figure 4 was found to exhibit greater light chopping efficiency when cut with three fingers instead of the solid plate or vane 11 of Figure 3. In the operation of the reed as shown in Figure 4, a light beam is interrupted three times instead of once for each swing of the reed.

Although the invention has been described in terms of a preferred embodiment, nevertheless changes and modifications obvious to those skilled in the art are deemed to be within the spirit, scope and contemplation of the invention in its broadest aspect.

What is claimed is:

1. Apparatus comprising a light sensitive element for translating light intensity into corresponding electrical signals, a source of light shining on said light sensitive element, and means to interrupt the light shining on said light sensitive element at regular intervals to produce an A.C. electrical signal at the output of said light sensitive element comprising a flexible strip anchored at one end, having a flag at its other end positioned between said source of light and said light sensitive element, and an intermediate portion of magnetically permeable material, transformer means coupled with said intermediate portion of said strip and circuit means to supply current to said transformer means to attract said strip and to stop the supply of current to said transformer means responsive to induced voltage in said transformer means.

2. Apparatus comprising a light sensitive element for translating light intensity into corresponding electrical signals, a source of light shining on said light sensitive element, and means to interrupt the light shining on said light sensitive element at regular intervals to produce an A.C. electrical signal at the output of said light sensitive element comprising a flexible strip anchored at one end, having a flag at its other end positioned between said source of light and said light sensitive element, and an intermediate portion of magnetically permeable material, a transistor and a transformer having a low impedance winding and a high impedance winding wrapped on a U-shaped core, said high impedance winding being connected in the collector circuit of said transistor, said low impedance winding connected in the base circuit of said transistor.

References Cited in the file of this patent

UNITED STATES PATENTS

| | | |
|---|---|---|
| 1,514,751 | Wold | Nov. 11, 1924 |
| 1,560,056 | Horton | Nov. 3, 1925 |
| 2,472,249 | De Giers | June 7, 1949 |
| 2,628,343 | Murray | Feb. 10, 1953 |
| 2,769,946 | Brailsford | Nov. 6, 1956 |
| 2,829,324 | Sargent | Apr. 1, 1958 |

FOREIGN PATENTS

| | | |
|---|---|---|
| 1,090,564 | France | Oct. 20, 1954 |